(12) United States Patent
Das et al.

(10) Patent No.: US 11,569,824 B2
(45) Date of Patent: Jan. 31, 2023

(54) DIGITAL SAMPLING TECHNIQUES

(71) Applicant: Arm Limited, Cambridge (GB)

(72) Inventors: Shidhartha Das, Upper Cambourne (GB); Yunpeng Cai, Nice (FR); Supreet Jeloka, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/344,390

(22) Filed: Jun. 10, 2021

(65) Prior Publication Data
US 2022/0399895 A1    Dec. 15, 2022

(51) Int. Cl.
| | |
|---|---|
| H03L 7/099 | (2006.01) |
| H03L 7/187 | (2006.01) |
| H03L 7/091 | (2006.01) |
| H03L 7/199 | (2006.01) |
| H03L 7/081 | (2006.01) |

(52) U.S. Cl.
CPC ............ H03L 7/099 (2013.01); H03L 7/0818 (2013.01); H03L 7/091 (2013.01); H03L 7/187 (2013.01); H03L 7/199 (2013.01)

(58) Field of Classification Search
CPC ....... H03L 7/093; H03L 7/0814; H03L 7/091; H03L 7/087; H03L 7/0891; H03L 7/07; H03L 7/089; G06F 30/367; G06F 1/04; H03K 5/135; H03K 3/0315; H03K 5/133; H03K 5/1534
See application file for complete search history.

(56) References Cited

U.S. PATENT DOCUMENTS

| | | | | |
|---|---|---|---|---|
| 6,114,917 A | * | 9/2000 | Nakajima | ............... H03L 7/083 327/263 |
| 2007/0047689 A1 | * | 3/2007 | Menolfi | ................ H03L 7/0807 375/376 |
| 2008/0002801 A1 | * | 1/2008 | Droege | ................... H03L 7/113 375/375 |
| 2016/0336943 A1 | * | 11/2016 | Wei | ......................... H03L 7/087 |

OTHER PUBLICATIONS

Whatmough, et al.; Power Integrity Analysis of a 28 nm Dual-Core ARM Cortex-A57 Cluster Using an All-Digital Power Delivery Monitor; IEEE Journal of Solid-State Circuits; vol. 52, No. 6; Jun. 2017.

(Continued)

*Primary Examiner* — John W Poos
(74) *Attorney, Agent, or Firm* — Pramudji Law Group PLLC; Ari Pramudji

(57) ABSTRACT

Various implementations described herein are directed to a device with a voltage-controlled oscillator that receives an enable signal, receives a reset signal, and provides internal pulse signals including one or more coarse internal pulse signals and multiple fine internal pulse signals. The device may have a coarse sampler that receives the one or more coarse internal pulse signal and provides a coarse sampled output signal. The device may have a fine sampler that receives the multiple fine internal pulse signals and provides a fine sampled output signal.

20 Claims, 5 Drawing Sheets

(56) References Cited

OTHER PUBLICATIONS

Mair, et al.; A 20nm 2.5GHz Ultra-Low-Power Tri-Cluster CPU Subsystem with Adaptive Power Allocation for Optimal Mobile SoC Performance; ISSCC 2016 / Session 4 / Digital Processors / 4.3; 2016 IEEE International Solid-State Circuits Conference (ISSCC); Feb. 1, 2016.

Ravezzi, et al.; Clock and Synchronization Networks for a 3 GHz 64 Bit ARMv8 8-Core SoC; IEEE Journal of Solid-State Circuits; vol. 50, No. 7; Jul. 2015.

Bowman, et al.; All-Digital Circuit-Level Dynamic Variation Monitor for Silicon Debug and Adaptive Clock Control; IEEE Transactions on Circuits and Systems—I: Regular Papers (vol. 58, No. 9); Sep. 2011.

Fukazawa, et al.; Fine-Grained In-Circuit Continuous-Time Probing Technique of Dynamic Supply Variations in SoCs; ISSCC 2007 / Session 16 / Power Distribution And Management /16.2; 2007 IEEE International Solid-State Circuits Conference; Feb. 13, 2007.

Alon, et al.; Circuits and Techniques for High-Resolution Measurement of On-Chip Power Supply Noise; IEEE Journal of Solid-State Circuits; vol. 40, No. 4; Apr. 2005.

Muhtaroglu, et al.; On-Die Droop Detector for Analog Sensing of Power Supply Noise; IEEE Journal of Solid-State Circuits; vol. 39, No. 4; Apr. 2004.

Restle, et al.; Timing Uncertainty Measurements on the Power5 Microprocessor; ISSCC 2004 / Session 19 / Clock Generation And Distribution / 19.7; 2004 IEEE International Solid-State Circuits Conference; Feb. 18, 2004.

\* cited by examiner

500

510 — generate internal pulse signals with a voltage-controlled oscillator, the internal pulse signals including one or more coarse internal pulse signals and multiple fine internal pulse signals 520 — sample the one or more coarse internal pulse signals with a coarse sampler so as to provide a coarse sampled output signal 530 — sample the multiple fine internal pulse signals with a fine sampler so as to provide a fine sampled output signal

FIG. 5

DIGITAL SAMPLING TECHNIQUES

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, continuing process technology scaling can ensure sustained area and power efficiency improvements. However, increased integration suffers with the added cost of increasing peak current and current density. Also, combining rapidly increasing supply current with the trends of decreasing supply voltage can place stringent requirements on power supply impedance, which needs to be small enough to avoid the fast supply current induced voltage collapse. However, the stagnant package inductance scaling exacerbates problematic trends. In some cases, power supply impedance can be small at low frequencies and close to DC, which is necessary to minimize IR voltage drop and power loss. However, the low impedance environment is prone to resonance. Generally, there are typically three significant resonance frequencies, which correspond to various interactions of a printed circuit board (PCB), package and the silicon die. The most significant one of these refers to a 1st order resonance (FPDN), which can arise due to die capacitance and package inductance as related to voltage droop/spike. Unfortunately, these problems can give rise to integrating peripheral circuitry into the SoC so as to activate the function of real-time on-chip monitoring and/or characterization of voltage noise.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

FIG. 5 illustrates a process diagram of a method for providing digital sampling architecture in accordance with various implementations described herein.

DETAILED DESCRIPTION

Various implementations described herein are directed to various digital sampling architecture schemes and techniques for supporting all-digital logic applications in reference to voltage-controlled oscillator (VCO) circuitry and associated logic as applied to an on-chip digital sampling oscilloscope (OC-DSO) configuration for continuously sensing supply noise of multi-core SoC designs in real-time. Various applications of digital sampling architecture may be used in digital standard cells with full DFT support, which may not be tied to a specific process node and which may be easily portable. The proposed design may refer to a solution that may be integrated to an all-digital adaptive clocking scheme.

In response to the challenges of achieving the desired OC-DSO performance, the various implementations described herein provide a novel structure that is a full standard cell based all-digital OC-DSO architecture with better scalability, higher sampling frequency while maintaining resolution and Vin range coverage. To evaluate the proposed VCO architecture, the entire VCO block may be implemented with a FinFET standard cell library using coarse sampling and fine sampling of multi-path gated VCO architecture having various sub-blocks, including, e.g., a multi-path, multi-stage gated VCO, coarse counters, counter registers, and counter selection decision logic. Also, the sub-blocks may include fine sampling flops and at least one hot-code generator along with a reset signal generator.

Various implementations of providing various digital sampling architecture will be described herein with reference to FIGS. 1-5.

Figure 1:
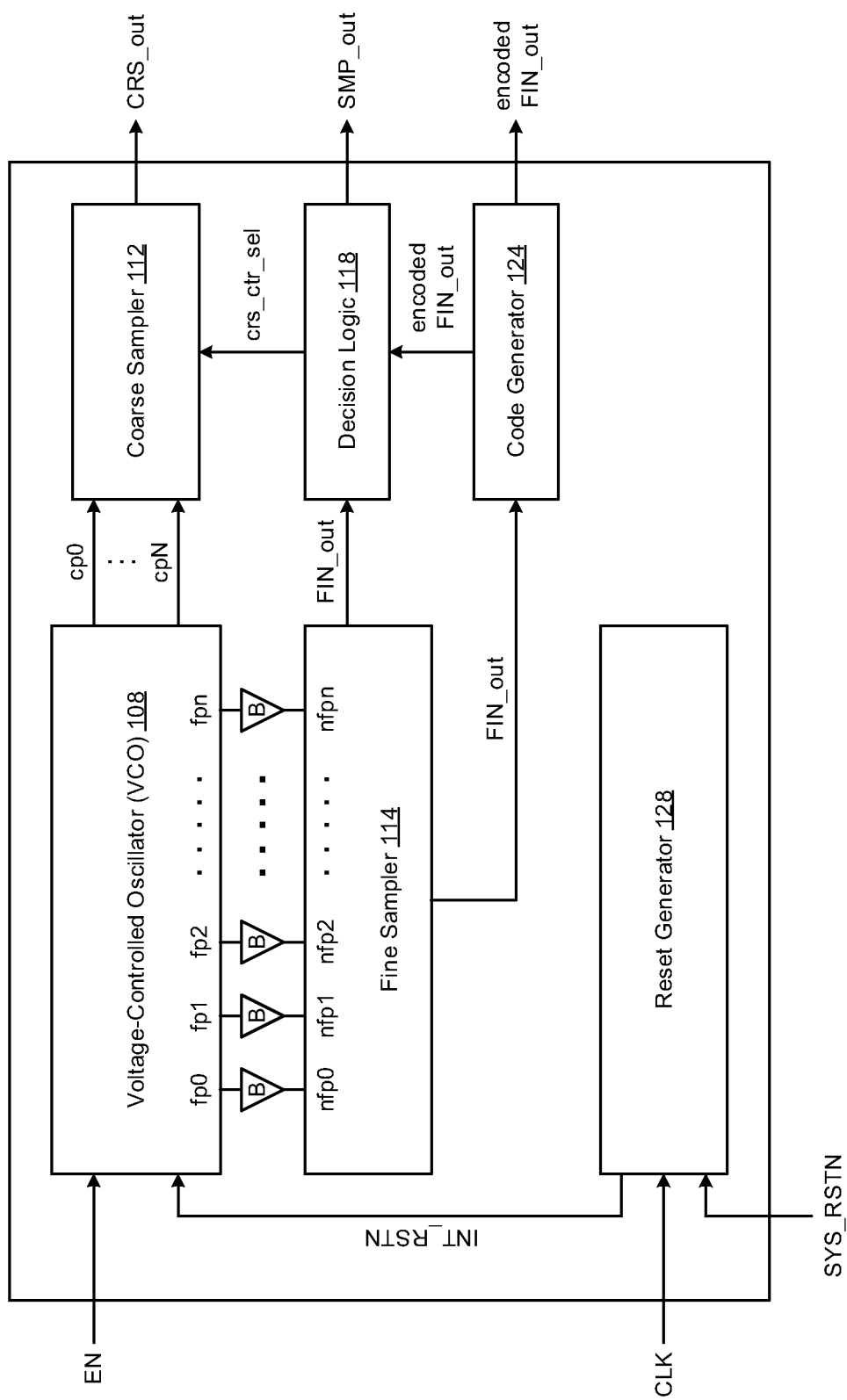
FIG. 1 illustrates a diagram of digital sampling architecture in accordance with various implementations described herein.

FIG. 1 illustrates a schematic diagram 100 of digital sampling architecture 104 in accordance with various implementations described herein. In various implementations, the digital sampling architecture 104 may refer to an all-digital architecture having a voltage-controlled oscillator (VCO) along with various associated logic that may be configured as an on-chip digital sampling oscilloscope (OC-DSO).

In various implementations, the digital sampling architecture may be implemented as a system or a device having various integrated circuit (IC) components that are arranged and coupled together as an assemblage or a combination of parts that provide for physical circuit designs and related structures. In some instances, a method of designing, providing, fabricating and/or manufacturing the digital sampling architecture as an integrated system or device may involve use of various IC circuit components described herein so as to implement various related fabrication schemes and techniques associated therewith. Further, the digital sampling architecture may be integrated with computing circuitry and related components on a single chip, and the digital sampling architecture may be implemented and/or incorporated in various embedded systems for automotive, electronic, mobile, server and also Internet-of-things (IoT) applications, including remote sensor nodes. Also, in some instances, the digital sampling architecture may be integrated with various infrastructure related components and parts, such as, e.g., server and/or cloud in the various types of systems targeted.

As shown in FIG. 1, the digital sampling architecture 104 may include a voltage-controlled oscillator (VCO) 108 that receives an enable signal (EN), receives a reset signal INT_RSTN), and provides internal pulse signals including one or more coarse internal pulse signals (cp0, ..., cpN) and multiple fine internal pulse signals (fp0, fp1, fp2, ..., fpn). Also, in various implementations, the voltage-controlled oscillator (VCO) 108 may include a multi-path gated structure with multiple delay stages including one or more resettable delay stages along with one or more non-resettable delay stages that are coupled together in series in an alternating manner. Also, in some instances, the multiple stages may refer to an odd number of delay stages such that a first number of resettable delay stages is greater than a second number of non-resettable delay stages. Various aspects associated with these features and related characteristics is described in greater detail herein in reference to FIG. 3.

In some implementations, the digital sampling architecture 104 may have a coarse sampler 112 that receives the one or more coarse internal pulse signals (cp0, . . . , cpN) and then provides a coarse sampled output signal (CRS_out). The coarse sampler 112 may be configured to receive a coarse counter select signal (crs_ctr_sel) from decision logic 118 and then provide the coarse sampled output signal (crs_ctr_sel) based on the one or more coarse internal pulse signals (cp0, . . . , cpN) and the coarse counter select signal (crs_ctr_sel).

In some implementations, the digital sampling architecture 104 may include a fine sampler 114 that receives the multiple fine internal pulse signals (fp0, fp1, fp2, . . . , fpn) and then provides a fine sampled output signal (FIN_out). Also, in some instances, the digital sampling architecture 104 may include a number of buffers (B) disposed between each fine output (fp0, fp1, fp2, . . . , fpn) of the VCO 108 and each corresponding fine input (nfp0, nfp1, nfp2, . . . , nfpn) of the fine sampler 114. Moreover, in various instances, the buffers (B) may be configured to operate as inverters that provide complementary signals between each fine output (fp0, fp1, fp2, . . . , fpn) of the VCO 108 and each corresponding fine input (nfp0, nfp1, nfp2, . . . , nfpn) of the fine sampler 114. Therefore, the fine sampler 114 may be configured to provide the fine sampled output signal (FIN_out) to decision logic 118 and code generator 124 based on the complementary fine input signals (nfp0, nfp1, nfp2, . . . , nfpn).

In some implementations, the digital sampling architecture 104 may include a reset generator 128 that is configured to receive a clock signal (CLK), receive a system reset signal (SYS_RSTN), and provide the reset signal (INT_RSTN) as an internal reset signal to the voltage-controlled oscillator (VCO) 108 based on the clock signal (CLK) and the system reset signal (SYS_RSTN). Also, the voltage-controlled oscillator (VCO) 108 may be configured to provide the internal pulse signals (fp0, fp1, fp2, . . . , fpn) based on the enable signal (EN) and the internal reset signal (INT_RSTN).

In some implementations, the digital sampling architecture 104 may include a code generator 124 that is configured to receive the fine sampled output signal (FIN_out) from the fine sampler 114 and also provide an encoded fine sampled output signal (encoded FIN_out). The code generator 124 may encode the fine sampled output signal (encoded FIN_out) and provide the encoded fine sampled output signal (encoded (FIN_out) based on encoding the fine sampled output signal (FIN_out).

In some implementations, the digital sampling architecture 104 may have decision logic 118 that is configured to receive the fine sampled output signal (FIN_out) from the fine sampler 114, receive the encoded fine sampled output signal (encoded FIN_out) from the code generator 124 and provide a coarse counter select signal (crs_ctr_sel) based on the fine sampled output signal (FIN_out) and the encoded fine sampled output signal (encoded FIN_out). Also, the coarse sampler 112 may be configured to receive the coarse counter select signal (crs_ctr_sel) from the decision logic 118 and provide the coarse sampled output signal (crs_ctr_sel) based on the one or more coarse internal pulse signals (cp0, . . . , cpN) and the coarse counter select signal (crs_ctr_sel). Also, the decision logic 118 may be configured to provide a sampled output signal (SMP_out) based on, e.g., the fine sampled output signal (FIN_out) and/or the encoded fine sampled output signal (encoded FIN_out).

Figure 2:
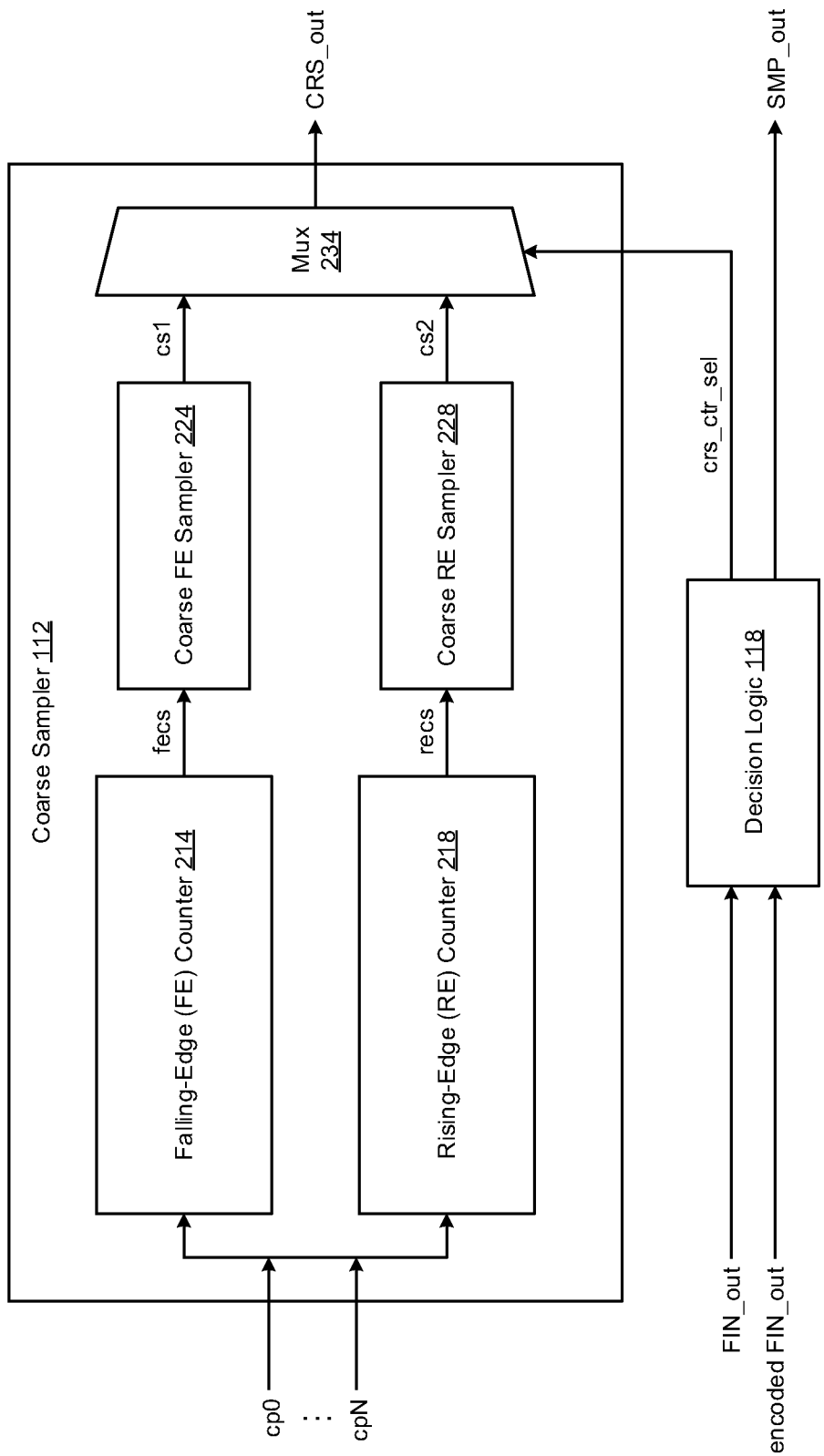
FIG. 2 illustrates a diagram of a coarse sampler and decision logic in accordance with various implementations described herein.

FIG. 2 illustrates a diagram 200 of coarse sampling architecture 204 having the coarse sampler 112 and the decision logic 118 in accordance with various implementations described herein. In some instances, the coarse sampler 112 and decision logic 118 refers to similar components as described herein in reference to FIG. 1.

In various implementations, the coarse sampling architecture may be implemented as a system or a device having various integrated circuit (IC) components that are arranged and coupled together as an assemblage or a combination of parts that provide for physical circuit designs and related structures. In some instances, a method of designing, providing, fabricating and/or manufacturing the coarse sampling architecture as an integrated system or device may involve use of various IC circuit components described herein so as to thereby implement various related fabrication schemes and techniques associated therewith. Also, the coarse sampling architecture may be integrated with computing circuitry and/or related components on a single chip, and the coarse sampling architecture may be implemented and/or incorporated in various embedded systems for automotive, electronic, mobile, server and also Internet-of-things (IoT) applications, including remote sensor nodes.

As shown in FIG. 2, the coarse sampling architecture 104 may include the coarse sampler 112 that is configured to receive the one or more coarse internal pulse signals (cp0, . . . , cpN) and provide the coarse sampled output signal (CRS_out) as output. Also, the coarse sampler 112 may be configured to receive the coarse counter select signal (crs_ctr_sel) from the decision logic 118 and then provide the coarse sampled output signal (CRS_out) based on the one or more coarse internal pulse signals (cp0, . . . , cpN) and the coarse counter select signal (crs_ctr_sel).

In some implementations, the coarse sampling architecture 104 may have a falling edge (FE) counter 214 configured to receive the one or more coarse internal pulse signals (cp0, . . . , cpN) from the voltage-controlled oscillator (VCO) 108 and provide a falling edge count signal (fecs). Also, in some instances, the coarse sampling architecture 104 may have a rising edge (RE) counter 218 configured to receive the one or more coarse internal pulse signals (cp0, . . . , cpN) from the voltage-controlled oscillator (VCO) 108 and provide a rising edge count signal (recs).

In some implementations, the coarse sampler 112 may have a coarse falling edge (FE) sampler 224 that receives the falling edge count signal (fecs) and provides a first input signal (cs1) to a multiplexer (Mux) 234. Also, the coarse sampler 112 may include a coarse rising edge (RE) sampler 228 that receives the rising edge count signal (recs) and provides a second input signal (cs2) to the multiplexer (Mux) 234. In some instances, the multiplexer (Mux) 234 may be configured to receive the first input signal (cs1), receive the second input signal (cs2), receive the coarse count select signal (crs_ctr_sel) from the decision logic 118, and provide the coarse sampled output signal (CRS_out).

Also, as shown in FIG. 2, the coarse sampling architecture 104 may include the decision logic 118 that is configured to receive the fine sampled output signal (FIN_out) from the fine sampler 114, receive the encoded fine sampled output signal (encoded FIN_out) from the code generator 124, and then provide the coarse counter select signal (crs_ctr_sel) to coarse sampler 112 based on the fine sampled output signal (FIN_out) and the encoded fine sampled output signal (encoded FIN_out). In some instances, the multiplexer (Mux) 234 may receive the coarse counter select signal (crs_ctr_sel) from the decision logic 118 as a mux selection signal. Also, in some instances, the decision logic 118 may be configured to provide the sampled output signal (SMP_out) based on, e.g., the fine sampled output signal (FIN_out) and/or the encoded fine sampled output signal (encoded FIN_out).

Figure 3:
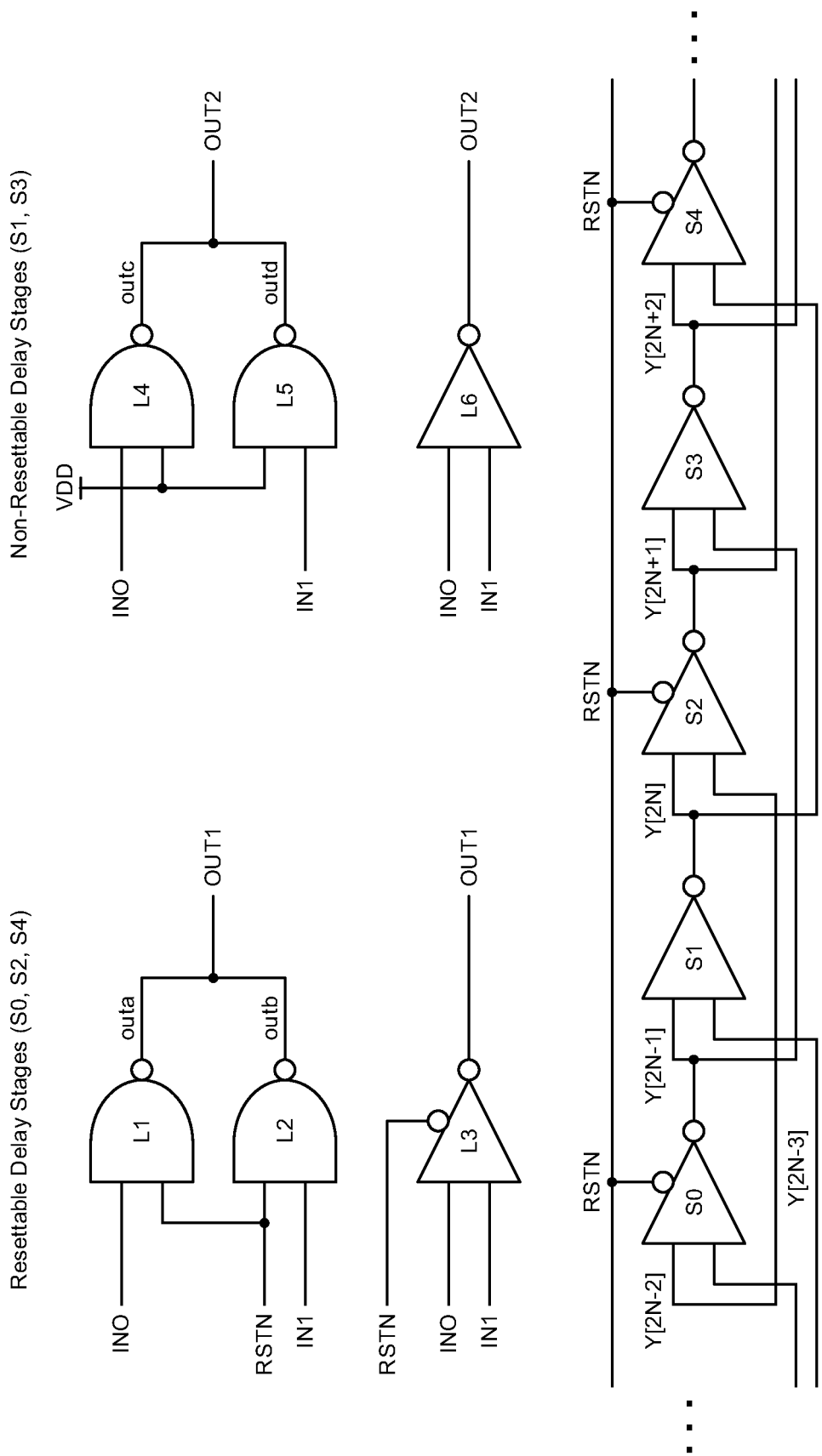
FIG. 3 illustrates a diagram of a voltage-controlled oscillator (VCO) architecture in accordance with various implementations described herein.

FIG. 3 illustrates a schematic diagram 304 of voltage-controlled oscillator (VCO) architecture 304 in accordance with various implementations described herein. Also, in some instances, the VCO architecture 304 may be implemented as a multi-path gated VCO having multiple delay stages. In some implementations, as shown in FIG. 3, the VCO architecture 304 may be configured with any number of delay stages, such as, e.g., 5 stages. However, any number of delay stages may be used to achieve various features, characteristics and/or behaviors that are associated with specific physical layout circuit designs.

In various implementations, VCO architecture may be implemented as a system or a device having various integrated circuit (IC) components that are arranged and coupled together as an assemblage or a combination of parts that provide for physical circuit designs and related structures. In various instances, a method of designing, providing, fabricating and/or manufacturing VCO architecture as an integrated system or device may involve use of the various IC circuit components described herein so as to implement various related fabrication schemes and techniques associated therewith. Also, the VCO architecture may be integrated with computing circuitry and related components on a single chip, and the VCO architecture may be implemented and/or incorporated in various embedded systems for automotive, electronic, mobile, server and also Internet-of-things (IoT) applications.

As shown in FIG. 3, the VCO architecture 304 may refer to a multi-path gated structure having a number (N) of multiple stages (e.g., S0, S1, . . . , SN) including one or more resettable delay stages (e.g., S0, S2, S4) and one or more non-resettable delay stages (e.g., S1, S3) that are coupled together in series in an alternating manner. In various instances, each resettable delay stage (e.g., S0, S2, S4) may be configured to receive input signals from one or more previous non-resettable delay stages (e.g., S1, S3), receive a reset control signal (RSTN), and provide an output signal based on the input signals and the reset control signal (RSTN). Also, in various instances, each non-resettable delay stage (e.g., S1, S3) may be configured to receive input signals from one or more previous resettable delay stages (e.g., S0, S2, S4), receive a source voltage signal (e.g., VDD), and provide an output signal based on the input signals and the source voltage signal (e.g., VDD).

In some implementations, the multiple stages (e.g., S0, S1, . . . , SN) refer to an odd number of stages such that a first number of resettable delay stages (e.g., S0, S2, S4) is at least greater than a second number of non-resettable delay stages (e.g., S1, S3). In some instances, as shown in FIG. 3, the multiple stages (E.g., So, S1, . . . , SN) may have an odd number of stages (e.g., N=5) that are coupled together in series. For instance, if N=5, then the odd number of stages may include a first stage (S0), a second stage (S1), a third stage (S2), a fourth stage (S3) and a fifth stage (S4) that are coupled together in series with three resettable delay stages (S0, S2, S4) and two non-resettable delay stages (S1, S3). As such, the resettable delay stages (S0, S2, S4) may include a first resettable delay stage (S0) and a second resettable delay stage (S3) along with a first non-resettable delay stage (S1) that is coupled between the first resettable delay stage (S0) and the second resettable delay stage (S2). Also, the resettable delay stages (S0, S2, S4) may have a third resettable delay stage (S4) along with a second non-resettable delay stage (S3) that is coupled between the second resettable delay stage (S2) and the third resettable delay stage (S4).

In some implementations, as shown in FIG. 3, each resettable delay stage (e.g., S0, S2, S4) may have one or more first delay elements (e.g., L1, L2) that are provided as components in a logic device (L3) that operates as a resettable delay stage. The first delay elements (e.g., L1, L2) may have a first logic gate (L1) that receives a first input signal (IN0) from a previous non-resettable delay stage, receives the reset control signal (RSTN), and provides a first reset output signal (outa) based on the first input signal (IN0) and reset control signal (RSTN). The first delay elements (e.g., L1, L2) may have a second logic gate (L2) that receives a second input signal (IN1) from another previous non-resettable delay stage, receives the reset control signal (RSTN), and provides a second reset output signal (outb) based on the second input signal (IN1) and reset control signal (RSTN). The first reset output signal (outa) or the second reset output signal (outb) may be provided as an output signal (OUT1) that is provided by each resettable delay stage (e.g., S0, S2, S4).

In some implementations, as shown in FIG. 3, each non-resettable delay stage (e.g., S1, S3) may have one or more second delay elements (e.g., L4, L5) that are provided as components in a logic device (L6) that operates as a non-resettable delay stage. The second delay elements (e.g., L4, L5) may have a first logic gate (L4) that receives the first input signal (IN0) from a previous resettable delay stage, receives the source voltage signal (VDD), and provides a first reset output signal (outc) based on the first input signal (IN0) and source voltage signal (VDD). The second delay elements (e.g., L4, L5) may have a second logic gate (L5) that receives the second input signal (IN1) from another previous resettable delay stage, receives the source voltage signal (VDD), and provides a second reset output signal (outd) based on the second input signal (IN1) and source voltage signal (VDD). The first reset output signal (outc) or the second reset output signal (outd) may be provided as an output signal (OUT2) that is provided by each non-resettable delay stage (e.g., S1, S3).

In various implementations, the resettable delay stages (e.g., S0, S2, S4) and the non-resettable delay stages (e.g., S1, S3) provide a series of sequential delay stages (e.g., Y[2N−2], Y[2N−1], Y[2N], Y[2N+1], Y[2N+2]). For instance, resettable stage (S2) represents delay stage (Y[2N]) in the series of sequential delay stages. Also, non-resettable stage (S1) represents delay stage (Y[2N−1]) and resettable stage (S0) represents delay stage (Y[2N−2]) in the series of sequential delay stages. Further, non-resettable stage (S3) represents delay stage (Y[2N+1]) and resettable stage (S4) represents delay stage (Y[2N+2]) in the series of sequential delay stages.

In some implementations, the voltage-controlled oscillator (VCO) architecture 304 may be configured as a multi-path gated VCO with 15-Stage NAND2-based multi-path delay elements (MDE). Different from a single-ended type VCO, the MDE sufficiently reduces the stage delay, which not only provides the 1st order noise shaping but also the highly sensitive to the voltage noise. In a multi-path gated VCO, the resettable and non-resettable multi-path delay elements (R-MDE/MDE) may be deployed. In some instances, interconnection of the multi-path gated VCO provides Y[2N] as an output of stage S(2), which depends on previous stage output Y[2N−1] and also output of 2 stages before which is Y[2N−3].

Figure 4:
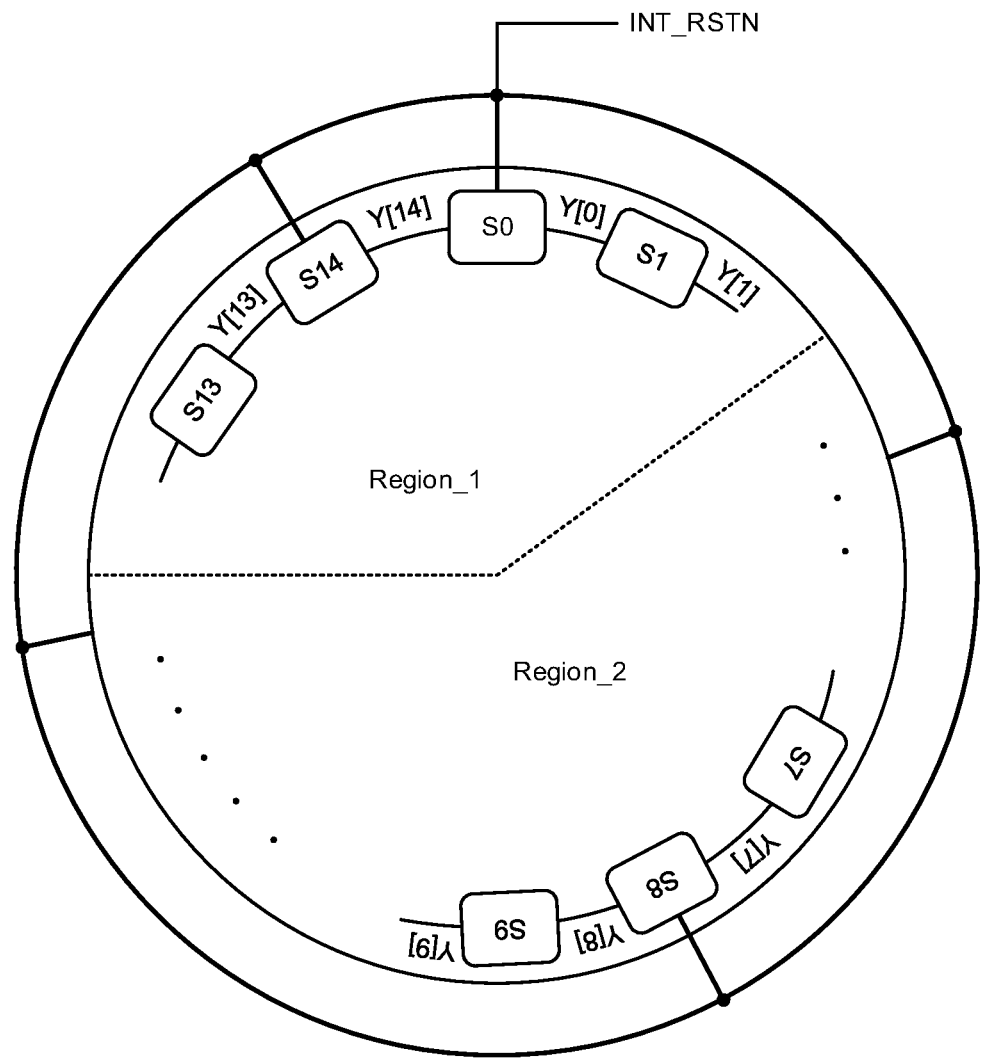
FIG. 4 illustrates a graph diagram of multi-stage transition regions in accordance with various implementations described herein.

FIG. 4 illustrates a graph diagram 400 of multi-stage transition regions 404 in accordance with various implementations described herein. As shown and described herein in reference to FIG. 3, the VCO architecture 304 in FIG. 3 may be configured with any number of delay stages, such as, e.g., 5 stages. However, in various implementations, any number of delay stages may be used to achieve various features, characteristics and/or behaviors associated with specific physical layout circuit designs. As shown in FIG. 4, the number of delay stages may refer to 15 delay stages.

In various implementations, the multi-stage transition regions 404 are provided in reference to a multi-path VCO having multiple stages, such as, e.g., 15 stages. For instance, as shown in FIG. 4, the multi-stage transition regions 404 may have a first transition region (Region_1) and a second transition region (Region_2). The first transition region (Region_1) may indicate that the transition position is among S13, S14, S0 and S1, wherein a trust bit of Region_1 is associated with Y[8]. Also, the second transition region (Region_2) may indicate that the transition position is among S7, S8 and S9, wherein the trust bit of Region_2 is associated with Y[0].

FIG. 5 illustrates a process flow diagram of a method 500 for providing digital sampling architecture in accordance with various implementations described herein. In some implementations, method 500 may be configured for digitally sampling a voltage-controlled oscillator (VCO) using coarse sampler logic and fine sampler logic.

It should be understood that even though method 500 indicates a particular order of operation execution, in some cases, various portions of operations may be executed in a different order, and on different systems. In other cases, additional operations and/or steps may be added to and/or omitted from method 500. Also, method 500 may be implemented in hardware and/or software. For instance, if implemented in hardware, method 500 may be implemented with various components and/or circuitry, as described in FIGS. 1-4. Also, in other instances, if implemented in software, method 500 may be implemented as a program or software instruction process configured for providing digital sampling architecture, as described herein. Also, in other instances, if implemented in software, instructions related to implementing method 500 may be stored in memory and/or a database. Thus, in various implementations, a computer or various other types of computing devices with a processor and memory may be configured to perform method 500.

As described in reference to FIG. 5, the method 500 may be used for fabricating and/or manufacturing, or causing to be fabricated and/or manufactured, an integrated circuit (IC) that implements various layout schemes and techniques in physical design as described herein so as to thereby provide digital sampling architecture using various related devices, components and/or circuitry as described herein.

At block 510, method 500 may be configured to generate internal pulse signals with a voltage-controlled oscillator (VCO), wherein the internal pulse signals include one or more coarse internal pulse signals and multiple fine internal pulse signals. Also, the voltage-controlled oscillator may be configured to operate as an on-chip scalable digital sampling oscilloscope with digital voltage frequency scaling (DVFS) capability. The voltage-controlled oscillator may refer to a multi-path gated structure with multiple stages including one or more resettable delay stages and one or more non-resettable delay stages that are coupled together in series and in an alternating manner. Also, in some implementations, the multiple stages may refer to an odd number of stages such that a first number of resettable delay stages is greater than a second number of non-resettable delay stages.

At block 520, method 500 may be configured to sample the one or more coarse internal pulse signals with a coarse sampler so as to provide a coarse sampled output signal. Also, at block 530, method 500 may be configured to sample the multiple fine internal pulse signals with a fine sampler so as to provide a fine sampled output signal.

In some implementations, each resettable delay stage receives input signals from previous non-resettable delay stages, receives a reset control signal and provides an output signal based on the input signals and the reset control signal. Also, in some implementations, each non-resettable delay stage receives input signals from previous resettable delay stages, receives a source voltage signal and provides an output signal based on the input signals and the source voltage signal.

In some implementations, method 500 may be configured to use a reset generator that receives a clock signal, receives a system reset signal, and provides the reset signal as an internal reset signal to the voltage-controlled oscillator based on the clock signal and the system reset signal. The voltage-controlled oscillator may provide the internal pulse signals based on the enable signal and the internal reset signal. Also, in various instances, method 500 may be configured to use a code generator that receives the fine sampled output signal from the fine sampler and provides an encoded fine sampled output signal. Also, the code generator may encode the fine sampled output signal and provides the encoded fine sampled output signal based on encoding the fine sampled output signal.

In some implementations, method 500 may be configured to use decision logic that receives the fine sampled output signal from the fine sampler, receives the encoded fine sampled output signal from the code generator and provides a coarse counter select signal based on the fine sampled output signal and the encoded fine sampled output signal. Also, the coarse sampler may receive the coarse counter select signal from the decision logic and provide the coarse sampled output signal based on the one or more coarse internal pulse signals and the coarse counter select signal.

In some implementations, the coarse sampler may have a falling edge counter that receives the one or more coarse internal pulse signals from the voltage-controlled oscillator and provides a falling edge count signal. The coarse sampler may have a rising edge counter that receives the one or more coarse internal pulse signals from the voltage-controlled oscillator and provides a rising edge count signal. The coarse sampler may have a coarse falling edge sampler that receives the falling edge count signal and provides first input signal to a multiplexer, and a coarse rising edge sampler that receives the rising edge count signal and provides second input signal to the multiplexer. Also, the multiplexer may receive the first input signal, receive the second input signal, receive the coarse count select signal from the decision logic, and then provide the coarse sampled output signal.

It should be intended that the subject matter of the claims not be limited to various implementations and/or illustrations provided herein, but should include any modified forms of those implementations including portions of implementations and combinations of various elements in reference to different implementations in accordance with the claims. It should also be appreciated that in development of any such implementation, as in any engineering or design project, numerous implementation-specific decisions should be made to achieve developers' specific goals, such as, e.g., compliance with system-related constraints and/or business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having a voltage-controlled oscillator that receives an enable signal, receives a reset signal, and provides internal pulse signals including one or more coarse internal pulse signals and multiple fine internal pulse signals. The device may have a coarse sampler that receives the one or more coarse internal pulse signal and provides a coarse sampled output signal. The device may have a fine sampler that receives the multiple fine internal pulse signals and provides a fine sampled output signal.

Described herein are various implementations of a device having a multi-path gated structure with delay stages including one or more resettable delay stages and one or more non-resettable delay stages coupled together in series. Also, each resettable delay stage may receive input signals from one or more previous non-resettable delay stages, receive a reset control signal and provide an output signal based on the input signals and the reset control signal. Also, each non-resettable delay stage may receive input signals from one or more previous delay stages, receive a source voltage signal and provide an output signal based on the input signals and the source voltage signal.

Described herein are various implementations of a method that may generate internal pulse signals with a voltage-controlled oscillator, and the internal pulse signals may include one or more coarse internal pulse signals and multiple fine internal pulse signals. The method may sample the one or more coarse internal pulse signals with a coarse sampler so as to provide a coarse sampled output signal. The method may sample the multiple fine internal pulse signals with a fine sampler so as to provide a fine sampled output signal.

Reference has been made in detail to various implementations, examples of which are illustrated in accompanying drawings and figures. In the following detailed description, numerous specific details are set forth to provide a thorough understanding of the disclosure provided herein. However, the disclosure provided herein may be practiced without these specific details. In various implementations, well-known methods, procedures, components, circuits and networks have not been described in detail so as not to unnecessarily obscure details of the embodiments.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and various other similar terms that indicate relative positions above or below a given point or element may be used in connection with various implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, specific features and/or acts described above are disclosed as example forms of implementing the claims.

What is claimed is:

1. A device comprising:
   a voltage-controlled oscillator that receives an enable signal, receives a reset signal, and provides internal pulse signals including one or more coarse internal pulse signals and multiple fine internal pulse signals;
   a coarse sampler that receives the one or more coarse internal pulse signal and provides a coarse sampled output signal; and
   a fine sampler that receives the multiple fine internal pulse signals and provides a fine sampled output signal.

2. The device of claim 1, wherein the device refers to an all-digital architecture with the voltage-controlled oscillator and associated logic as an on-chip digital sampling oscilloscope (OC-DSO).

3. The device of claim 1, wherein the voltage-controlled oscillator comprises a multi-path gated structure having multiple stages including one or more resettable delay stages and one or more non-resettable delay stages coupled together in series in an alternating manner.

4. The device of claim 3, wherein the multiple stages refer to a first number of resettable delay stages and a second number of non-resettable delay stages, and wherein insertion of the first number of resettable delay stages provide for a quick reset between cycles.

5. The device of claim 4, wherein:
   each resettable delay stage receives input signals from previous non-resettable delay stages, receives a reset control signal and provides an output signal based on the input signals and the reset control signal, and
   each non-resettable delay stage receives input signals from previous delay stages, receives a source voltage signal and provides an output signal based on the input signals and the source voltage signal.

6. The device of claim 1, further comprising:
a reset generator that receives a clock signal, receives a system reset signal, and provides the reset signal as an internal reset signal to the voltage-controlled oscillator based on the clock signal and the system reset signal,
wherein the voltage-controlled oscillator provides the internal pulse signals based on the enable signal and the internal reset signal.

7. The device of claim 1, further comprising:
a code generator that receives the fine sampled output signal from the fine sampler and provides an encoded fine sampled output signal,
wherein the code generator encodes the fine sampled output signal and provides the encoded fine sampled output signal based on encoding the fine sampled output signal.

8. The device of claim 7, further comprising:
decision logic that receives the fine sampled output signal from the fine sampler, receives the encoded fine sampled output signal from the code generator and provides a coarse counter select signal based on the fine sampled output signal and the encoded fine sampled output signal,
wherein the coarse sampler receives the coarse counter select signal from the decision logic and provides the coarse sampled output signal based on the one or more coarse internal pulse signals and the coarse counter select signal.

9. The device of claim 8, wherein the coarse sampler comprises:
a falling edge counter that receives the one or more coarse internal pulse signals from the voltage-controlled oscillator and provides a falling edge count signal; and
a rising edge counter that receives the one or more coarse internal pulse signals from the voltage-controlled oscillator and provides a rising edge count signal.

10. The device of claim 9, wherein the coarse sampler comprises:
a coarse falling edge sampler that receives the falling edge count signal and provides a first input signal to a multiplexer; and
a coarse rising edge sampler that receives the rising edge count signal and provides a second input signal to the multiplexer,
wherein the multiplexer receives the first input signal, receives the second input signal, receives the coarse count select signal from the decision logic, and provides the coarse sampled output signal.

11. A device comprising:
a multi-path gated structure having delay stages including one or more resettable delay stages and one or more non-resettable delay stages coupled together in series,
wherein each resettable delay stage receives input signals from one or more previous non-resettable delay stages, receives a reset control signal and provides an output signal based on the input signals and the reset control signal, and
wherein each non-resettable delay stage receives input signals from one or more previous delay stages, receives a source voltage signal and provides an output signal based on the input signals and the source voltage signal.

12. The device of claim 11, wherein the device is a voltage-controlled oscillator (VCO).

13. The device of claim 12, wherein the voltage-controlled oscillator (VCO) is implemented as part of an on-chip digital sampling oscilloscope (OC-DSO).

14. The device of claim 11, wherein the multiple stages have an odd number of stages that are coupled together in series.

15. The device of claim 14, wherein:
the one or more non-resettable delay stages include a first non-resettable delay stage and a second non-resettable delay stage, and
the one or more resettable delay stages include a first resettable delay stage coupled between the first non-resettable delay stage and the second non-resettable delay stage.

16. The device of claim 11, wherein:
each resettable delay stage has one or more first delay elements, and
each non-resettable delay stage has one or more second delay elements.

17. The device of claim 16, wherein:
the one or more first delay elements include a first logic gate that receives a first input signal from a previous non-resettable delay stage, receives the reset control signal, and provides a first reset output signal based on the first input signal and the reset control signal,
the one or more first delay elements include a second logic gate that receives a second input signal from another previous non-resettable delay stage, receives the reset control signal, and provides a second reset output signal based on the second input signal and the reset control signal, and
the first reset output signal or the second reset output signal is provided as the output signal provided by each resettable delay stage.

18. The device of claim 16, wherein:
the one or more second delay elements include a first logic gate that receives a first input signal from a previous resettable delay stage, receives the source voltage signal, and provides a first delay output signal based on the first input signal and the source voltage signal,
the one or more second delay elements include a second logic gate that receives a second input signal from another previous resettable delay stage, receives the source voltage signal, and provides a second delay output signal based on the second input signal and the source voltage signal, and
the first delay output signal or the second delay output signal is provided as the output signal provided by each non-resettable delay stage.

19. A method comprising:
generating internal pulse signals with a voltage-controlled oscillator, the internal pulse signals including one or more coarse internal pulse signals and multiple fine internal pulse signals;
sampling the one or more coarse internal pulse signals with a coarse sampler so as to provide a coarse sampled output signal; and
sampling the multiple fine internal pulse signals with a fine sampler so as to provide a fine sampled output signal.

20. The method of claim 19, wherein:
the voltage-controlled oscillator is configured to operate as an on-chip scalable digital sampling oscilloscope with digital voltage frequency scaling (DVFS) capability, and
the voltage-controlled oscillator comprises a multi-path gated structure having multiple stages including one or more resettable delay stages and one or more non-resettable delay stages coupled together in series.

\* \* \* \* \*